(12) United States Patent
Hu et al.

(10) Patent No.: US 8,680,910 B1
(45) Date of Patent: Mar. 25, 2014

(54) METHOD AND APPARATUS FOR GLITCH-FREE SWITCHING OF MULTIPLE PHASE CLOCK

(75) Inventors: Pengfei Hu, Shanghai (CN); Liang Zhang, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 40 days.

(21) Appl. No.: 12/640,750

(22) Filed: Dec. 17, 2009

(51) Int. Cl.
*G06F 1/04* (2006.01)
(52) U.S. Cl.
USPC .............................. 327/298; 327/291; 327/294
(58) Field of Classification Search
USPC ........................................................ 327/298
See application file for complete search history.

(56) References Cited

U.S. PATENT DOCUMENTS

| | | | | |
|---|---|---|---|---|
| 6,178,185 | B1 * | 1/2001 | Marks | 370/514 |
| 7,081,777 | B2 * | 7/2006 | Huang et al. | 327/99 |
| 7,378,893 | B1 * | 5/2008 | Kang | 327/291 |
| 7,446,588 | B2 * | 11/2008 | Boerstler et al. | 327/298 |
| 7,671,654 | B2 * | 3/2010 | Rozen et al. | 327/291 |
| 2007/0002727 | A1 * | 1/2007 | Stessen et al. | 370/210 |
| 2007/0228371 | A1 * | 10/2007 | Asano et al. | 257/48 |
| 2008/0315890 | A1 * | 12/2008 | Kasai et al. | 324/523 |
| 2009/0192576 | A1 * | 7/2009 | Seifert et al. | 607/116 |
| 2010/0008460 | A1 * | 1/2010 | Zhang et al. | 375/376 |

\* cited by examiner

*Primary Examiner* — Ryan Jager
(74) *Attorney, Agent, or Firm* — Heimlich Law, PC; Alan Heimlich, Esq.

(57) ABSTRACT

A method and apparatus for glitch-free switching of multiple phase clock have been disclosed where switching from one phase to another phase is done step-by-step to avoid generating a glitch.

3 Claims, 7 Drawing Sheets

METHOD AND APPARATUS FOR GLITCH-FREE SWITCHING OF MULTIPLE PHASE CLOCK

FIELD OF THE INVENTION

The present invention pertains to switching of a multiple phase clock. More particularly, the present invention relates to a method and apparatus for glitch-free switching of multiple phase clock.

BACKGROUND OF THE INVENTION

Multiple phase clocks are used in a variety of systems. For example, data recovery, when the clock phase needs to be put forward or backward, especially when calibration and training are needed. In some chips such as memory a clock phase often needs to be calibrated or trained to get maximum timing margin and to achieve maximum work frequency. However directly switching to another phase can cause glitches and abrupt timing changes. This presents a problem.

BRIEF DESCRIPTION OF THE DRAWINGS

The invention is illustrated by way of example and not limitation in the figures of the accompanying drawings in which.

DETAILED DESCRIPTION

In one embodiment of the present invention, switching from one phase to another is done in a step-by-step manner. Switching always happens between adjacent phases. In this way glitches are removed.

In one embodiment an apparatus of the invention uses primarily D-type flip flops (DFF) and some logic gates.

Generating multiple phase clocks are known to one of skill in the art and are not germane to understanding the present invention which deals with switching phases not generating them. Multiple phase clock may be easily generated, for example patent U.S. Pat. No. 7,323,918 used a DLL. Patent U.S. Pat. No. 6,809,567 used a Johnson counter. For discussion purposes, the present invention assumes the multiple phase clock has been generated with some method.

Figure 3:
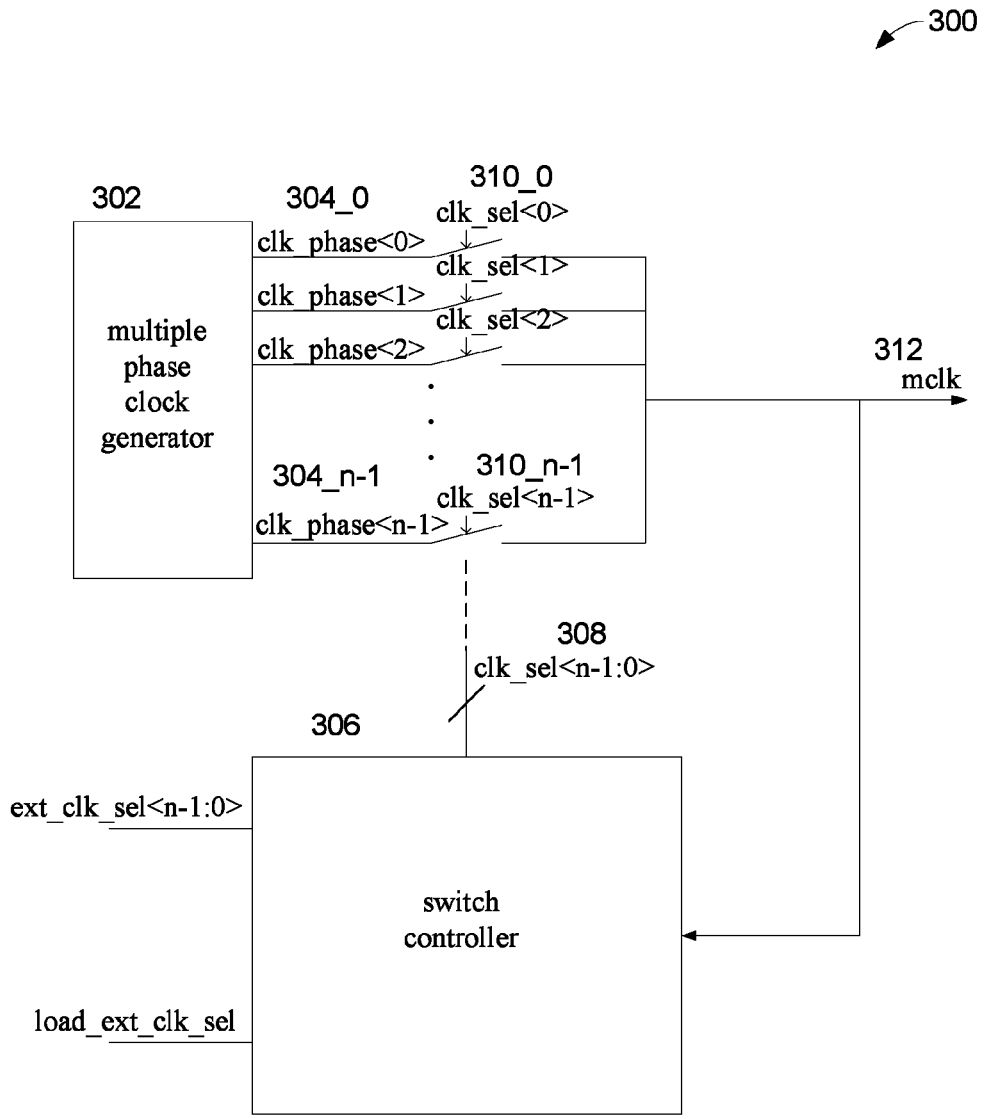
FIG. 3 illustrates one embodiment of the invention showing in block form schematically glitch free switching of a multiple phase clock.

FIG. 3 illustrates, generally at 300, one embodiment of the invention showing in block form schematically glitch free switching of a multiple phase clock. At 302 is a multiple phase clock generator having n clock phase outputs denoted clk_phase<0> to clk_phase<n−1> respectively 304_0 to 304_n−1. At 306 is a switch controller having n outputs at 308 denoted clk_sel<n−1:0>. Each of said clk_sel<n−1:0> respective outputs is tied to a respective switch 310_n−1 to 310_0 which has as an input a respective 304_n−1 to 304_0 output. The outputs of the switches 310_n−1 to 310_0 are tied to an output clock denoted mclk at 312.

Figure 4:
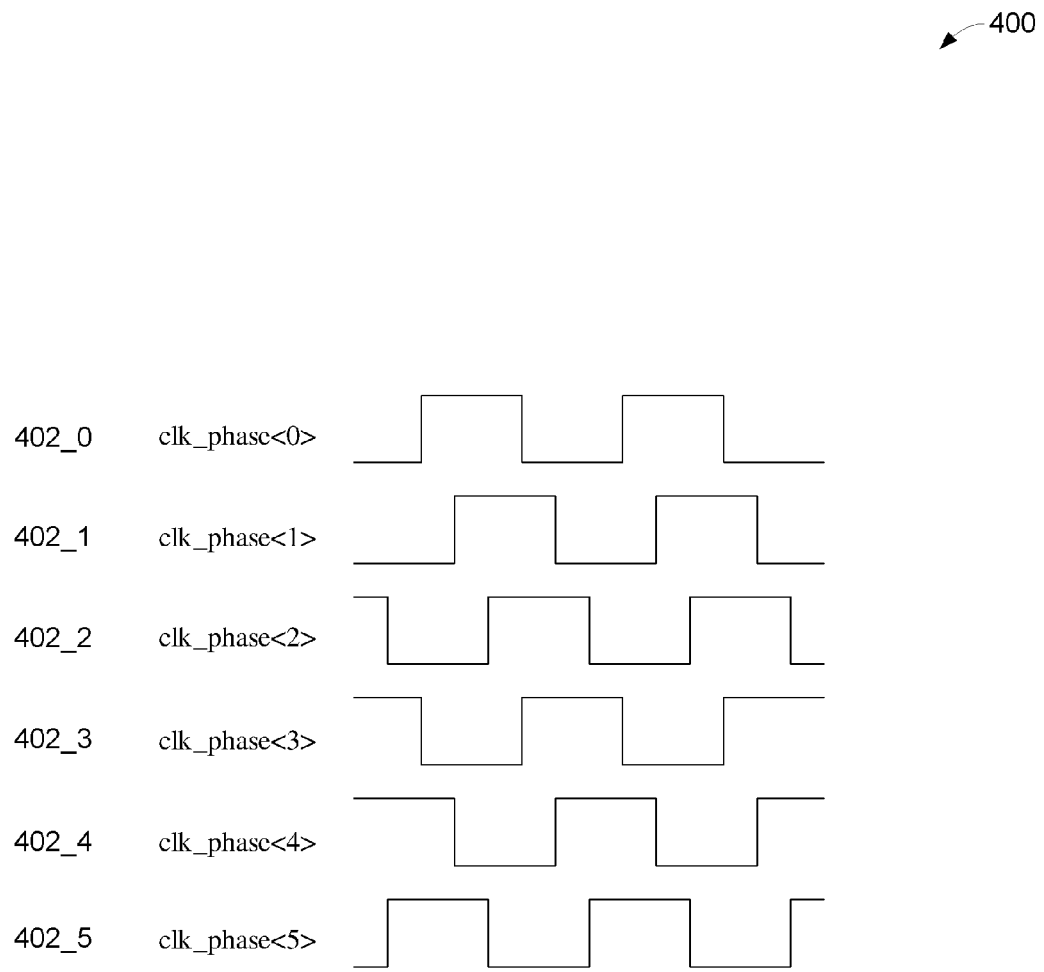
FIG. 4 illustrates showing a multiple phase clock waveform (n=6)

FIG. 4 illustrates, generally at 400, showing a multiple phase clock waveform (n=6). At 402_0 through 402_5 are shown respectively clk_phase<0> through clk_phase<5>. This illustrates the relationship of the 6 phase of this multiple phase clock.

Figure 5:
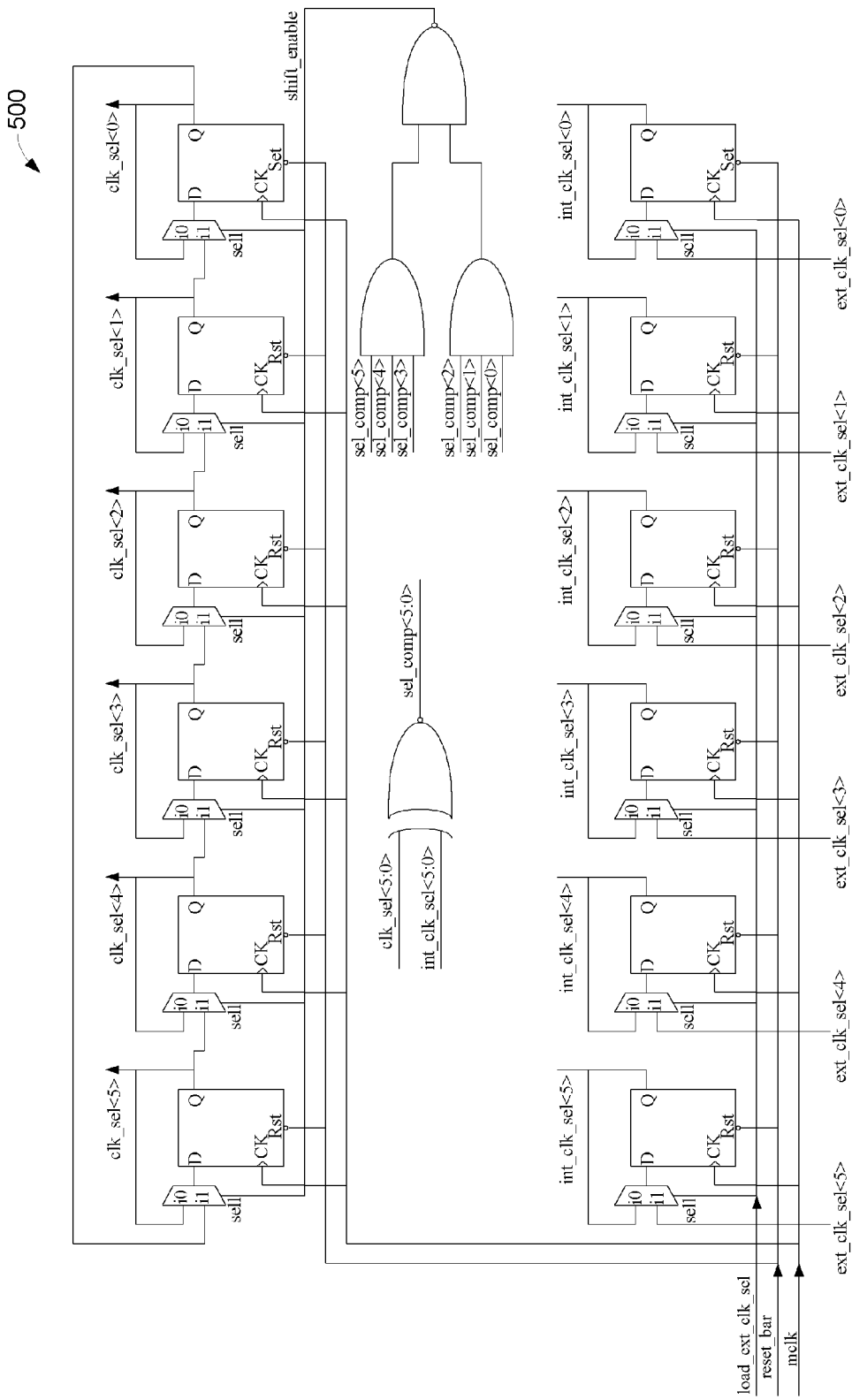
FIG. 5 illustrates one embodiment of the invention showing a schematic of a switch controller (n=6)

FIG. 5 illustrates, generally at 500, one embodiment of the invention showing a schematic of a switch controller (n=6) for a 6 phase multiple phase clock (such as that shown in FIG. 4).

Figure 6:
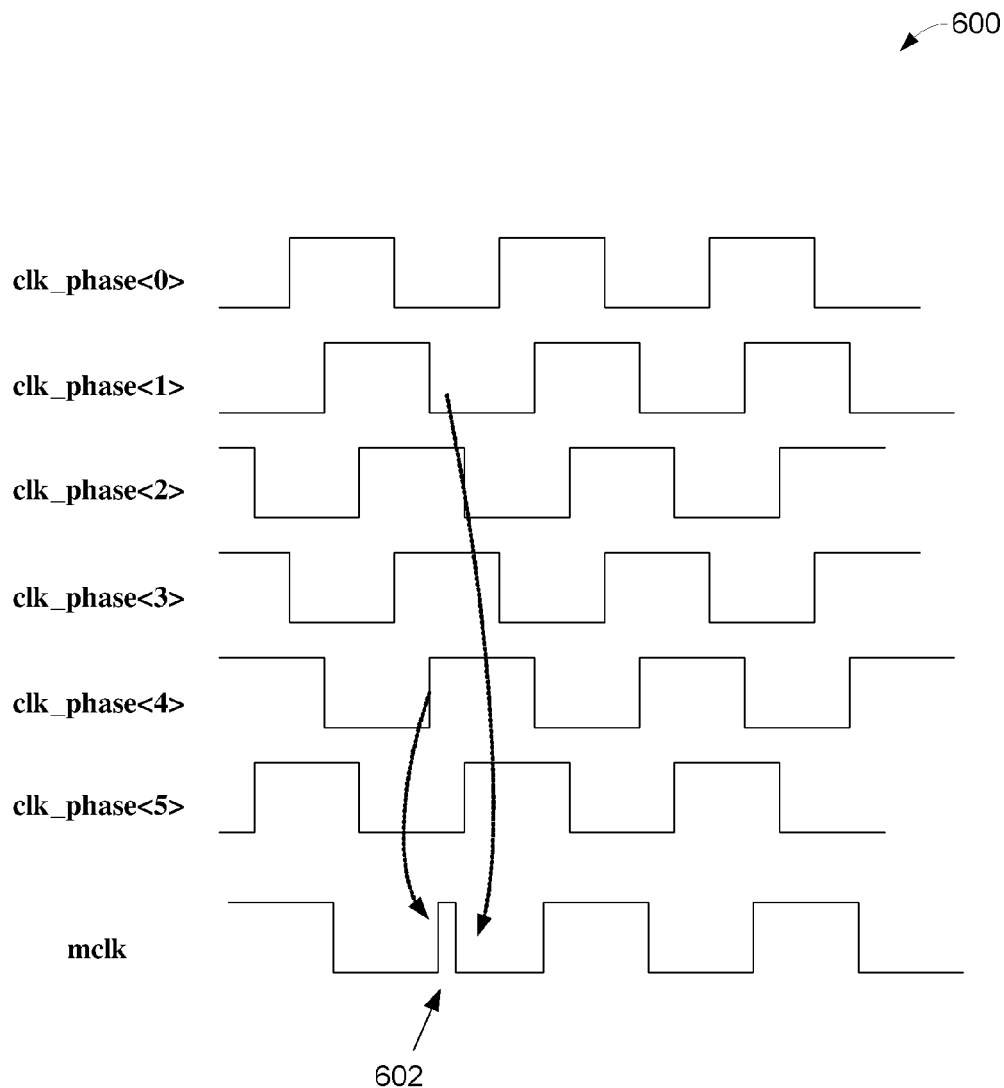
FIG. 6 illustrates a direct switching approach.

FIG. 6 illustrates, generally at 600, a direct switching approach. At 602 may be seen a glitch on mclk as a result of the direct switching approach.

Figure 7:
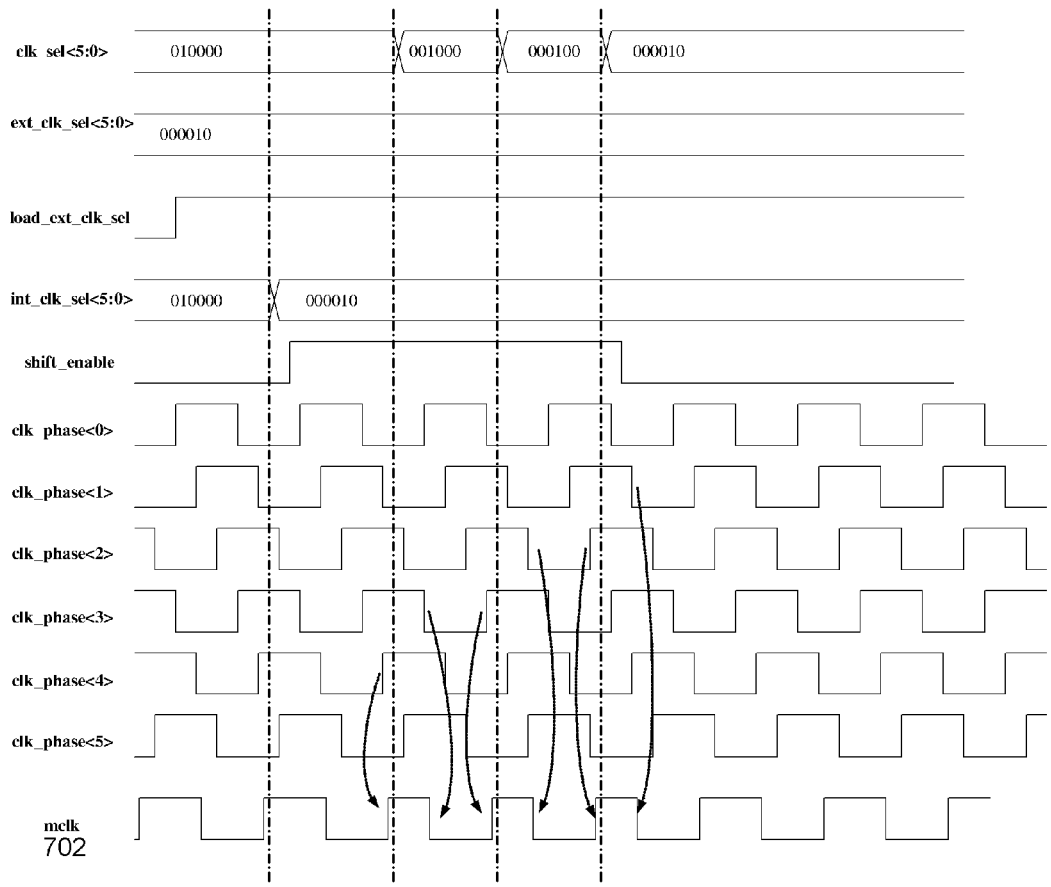
FIG. 7 illustrates one embodiment of the invention showing switching.

FIG. 7 illustrates, generally at 700, one embodiment of the invention showing switching. FIG. 7 illustrates signals and outputs from using a circular shift register, such as shown in FIG. 5. Notably absent from mclk 702 are any glitches.

FIG. 7 illustrates step by step switching from phase 4 to phase 1. In detail FIG. 7 operation as illustrated is as follows. With reference to FIG. 7, the operation of technique will be explained. Here a 6-phase clock switching is taken as an example. Assume the current phase is clk_phase<4> (clk_sel<5:0>=010000) and the next phase is clk_phase<1>. When load_ext_clk_sel goes high ext_clk_sel<5:0> is loaded to the registers and int_clk_sel<5:0> gets the new value 000010. This is different from clk_sel<5:0>, which makes shift_enable high. Next clk_sel<5:0> changes from 010000 to 001000 at the rising edge of mclk and clk_phase<3> is selected to mclk. This happens again and clk_sel<5:0> get 000100 and clk_phase<2> is selected. Finally clk_sel<5:0>=000010 and clk_phase<1> is selected. Because clk_sel<5:0> has the same value with int_clk_sel<5:0> shift_enable goes low from high. The circular register stops shifting to keep clk_sel<5:0>=000010 until another new ext_clk_sel<5:0> is loaded to the int_clk_sel<5:0> registers.

While the operation of a 6 phase clock has been discussed, the invention is not so limited and the technique disclosed may be used with any number of clock phases, that is n may an arbitrary number.

Thus a method and apparatus for glitch-free switching of multiple phase clock have been described.

Figure 1:
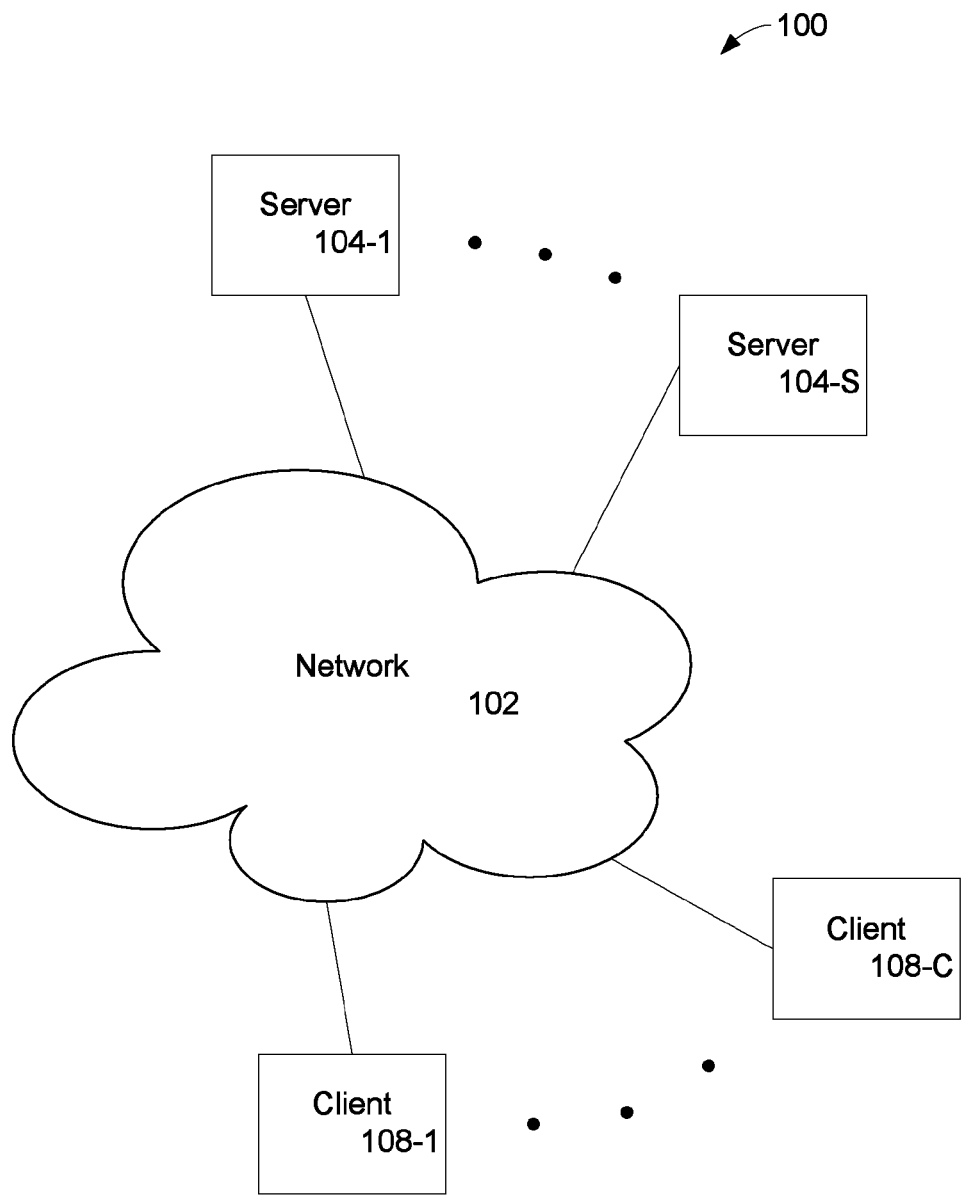
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
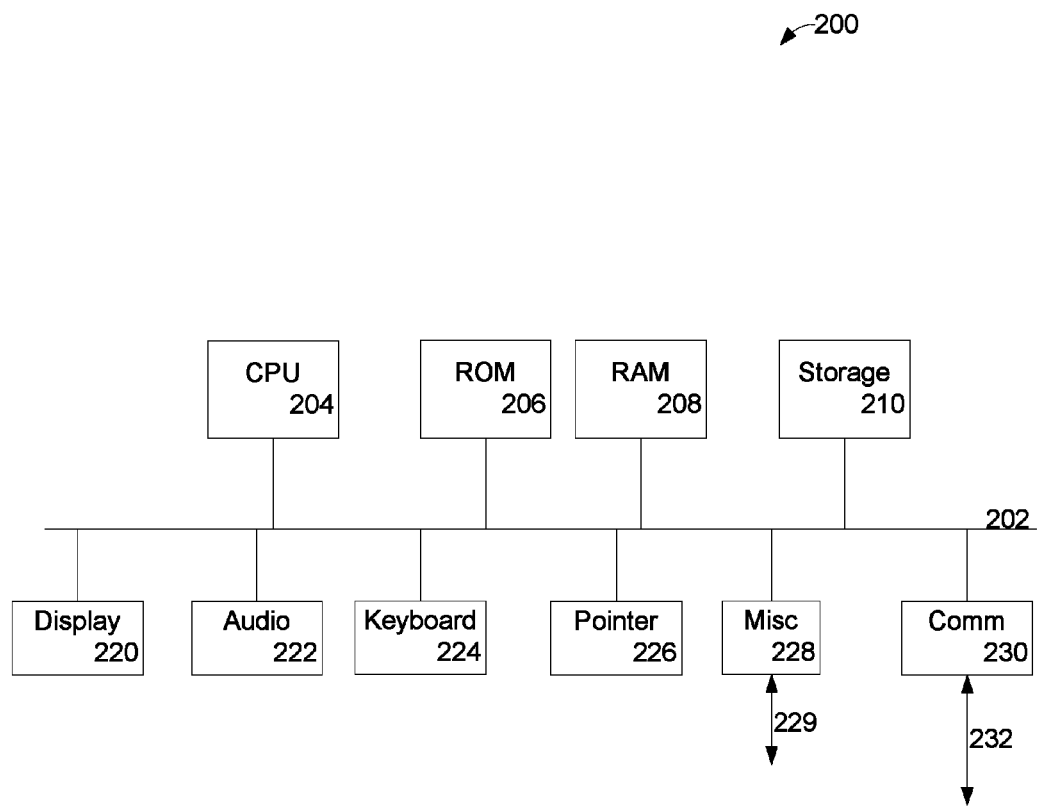
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Various spellings may be used for terms used in the description. These variations are to be understood to relate to the same term unless denoted otherwise. For example: fail-safe is also spelled fail safe, and failsafe; start-up is also spelled startup, and start up; subthreshold is also spelled sub-threshold, and sub threshold; etc.

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as ""substantially equal" is used to indicate that they are for all practical purposes equal.

It is to be understood that in any one or more embodiments of the invention where alternative approaches or techniques are discussed that any and all such combinations as my be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for glitch-free switching of multiple phase clock have been described.

What is claimed is:

1. An apparatus comprising:
a multiple phase clock generator, said multiple phase clock generator having a plurality of n phase outputs denoted 0 through n−1 wherein said plurality of n phase outputs denoted 0 through n−1 have a first duty cycle;
a plurality of n switches, said plurality of n switches denoted 0 through n−1, wherein each respective said plurality of n phase outputs denoted 0 through n−1 is in operative communication with each respective said plurality of n switches denoted 0 through n−1;
a switch controller, said switch controller having a plurality of n select outputs denoted 0 through n−1, wherein each respective said plurality of n select outputs denoted 0 through n−1 is in operative communication with each respective said plurality of n switches denoted 0 through n−1 and wherein said switch controller plurality of n select outputs when changing state produce a glitch-free output at a second duty cycle wherein said second duty cycle is not equal to said first duty cycle; and
a circular shift register, said circular shift register generating said n select outputs, and wherein said circular shift register is a left shift circular shift register and wherein said left shift circular shift register stops shifting when said changing state is completed and wherein said left shift circular shift register further comprises a load external clock set input and an external clock select input.

2. A method comprising:
providing a multiple phase clock generator, said multiple phase clock generator having a plurality of n phase outputs denoted 0 through n−1 wherein said plurality of n phase outputs denoted 0 through n−1 have a first duty cycle;
providing a plurality of n switches, said plurality of n switches denoted 0 through n−1, wherein each respective said plurality of n phase outputs denoted 0 through n−1 is in operative communication with each respective said plurality of n switches denoted 0 through n−1;
providing a switch controller, said switch controller having a plurality of n select outputs denoted 0 through n−1, wherein each respective said plurality of n select outputs denoted 0 through n−1 is in operative communication with each respective said plurality of n switches denoted 0 through n−1 and wherein said switch controller plurality of n select outputs when changing state produce a glitch-free output at a second duty cycle wherein said second duty cycle is not equal to said first duty cycle; and
providing a circular shift register, said circular shift register generating said n select outputs, and wherein said circular shift register is a left shift circular shift register and wherein said left shift circular shift register stops shifting when said changing state is completed and wherein said left shift circular shift register further comprises a load external clock set input and an external clock select input.

3. An apparatus comprising:
a multiple phase clock generator, said multiple phase clock generator having a plurality of n phase outputs denoted 0 through n−1 wherein said plurality of n phase outputs denoted 0 through n−1 have a first duty cycle;
a plurality of n switches, said plurality of n switches denoted 0 through n−1, wherein each respective said plurality of n phase outputs denoted 0 through n−1 is in operative communication with each respective said plurality of n switches denoted 0 through n−1;

a switch controller, said switch controller having a plurality of n select outputs denoted 0 through n−1, wherein each respective said plurality of n select outputs denoted 0 through n−1 is in operative communication with each respective said plurality of n switches denoted 0 through n−1 and wherein said switch controller plurality of n select outputs when changing state produce a glitch-free output at a second duty cycle wherein said second duty cycle is not equal to said first duty cycle; and a circular shift register, said circular shift register generating said n select outputs, and wherein said circular shift register is a right shift circular shift register and wherein said right shift circular shift register stops shifting when said changing state is completed and wherein said right shift circular shift register further comprises a load external clock set input and an external clock select input.

\* \* \* \* \*